(12) United States Patent
Hobelsberger et al.

(10) Patent No.: US 7,102,379 B2
(45) Date of Patent: Sep. 5, 2006

(54) APPARATUS AND METHOD FOR MONITORING AND/OR ANALYSIS OF ELECTRICAL MACHINES DURING OPERATION

(75) Inventors: Max Hobelsberger, Wuerenlingen (CH); Ingo Kirchhoff, Bellikon (CH); Zlatimir Posedel, Neuenhof (CH)

(73) Assignee: ALSTOM Technology Ltd., Baden (CH)

( * ) Notice: Subject to any disclaimer, the term of this patent is extended or adjusted under 35 U.S.C. 154(b) by 0 days.

(21) Appl. No.: 11/075,523

(22) Filed: Mar. 9, 2005

(65) Prior Publication Data

US 2005/0200378 A1  Sep. 15, 2005

Related U.S. Application Data

(63) Continuation of application No. PCT/EP03/50611, filed on Sep. 5, 2003.

(30) Foreign Application Priority Data

Sep. 10, 2002  (CH) .................................... 1531/02

(51) Int. Cl.
*G01R 31/34* (2006.01)

(52) U.S. Cl. .................................... 324/772

(58) Field of Classification Search ................ 324/772, 324/158.1, 500, 545–546; 318/490; 322/99; 702/58, 183
See application file for complete search history.

(56) References Cited

U.S. PATENT DOCUMENTS

| 3,653,019 | A | 3/1972 | Barton et al. ............ 340/248 P |
|---|---|---|---|
| 3,885,420 | A | 5/1975 | Wolfinger ................... 73/70.1 |
| 3,934,459 | A | 1/1976 | Wolfinger et al. ........... 73/70.1 |
| 4,058,804 | A | 11/1977 | Sawade et al. ............. 340/248 |
| 4,137,780 | A | 2/1979 | Wolfinger ..................... 73/650 |
| 4,148,222 | A | 4/1979 | Wolfinger ..................... 73/650 |
| 4,163,227 | A | 7/1979 | Sawade et al. ............. 340/662 |
| 4,317,371 | A | 3/1982 | Wolfinger ..................... 73/650 |
| 4,444,064 | A | 4/1984 | Wolfinger ................. 73/862.34 |
| 4,451,786 | A | 5/1984 | Sawade et al. ............. 324/158 |
| 4,577,151 | A | 3/1986 | Tanisaka et al. ........... 324/158 |

(Continued)

FOREIGN PATENT DOCUMENTS

DE  197 42 622  4/1999

(Continued)

OTHER PUBLICATIONS

International Search Report, International Application. No. PCT/EP 03/050611, European Patent Office, Sep. 5, 2003.

*Primary Examiner*—Vinh P. Nguyen
(74) *Attorney, Agent, or Firm*—Darby & Darby

(57) ABSTRACT

An apparatus and a method for monitoring and/or analysis of electrical machines during operation, wherein the electrical machine has at least one generator with a shaft and drive means for driving this shaft, wherein the shaft is grounded at the first end of the generator, and wherein a measurement unit for measurement of shaft voltage and/or shaft current as a function of time is provided on the shaft at the second end of the generator. An apparatus such as this allows the combined and simultaneous measurement of various fault states by supplying signals for the shaft voltage and/or the shaft current to an analysis unit, wherein the analysis unit allows combined and simultaneous analysis of at least two potential fault states of the electrical machine. Simultaneous cross-relationships between the individual measurement results of individual fault states may be provided so as to allow a clearer and more reliable diagnosis of critical states, not possible when individual phenomena are considered separately.

29 Claims, 1 Drawing Sheet

U.S. PATENT DOCUMENTS

| | | | |
|---|---|---|---|
| 4,814,699 A | 3/1989 | Koziel et al. | 324/158 MG |
| 4,831,295 A | 5/1989 | Posedel | 310/72 |
| 5,006,769 A | 4/1991 | Posedel | 318/434 |
| 6,091,236 A | 7/2000 | Piety et al. | 324/103 P |
| 6,460,013 B1 | 10/2002 | Nippes | 702/183 |

FOREIGN PATENT DOCUMENTS

| | | |
|---|---|---|
| EP | 0 271 678 | 6/1988 |
| EP | 0 391 181 | 10/1990 |
| WO | WO 00/69062 | 11/2000 |

APPARATUS AND METHOD FOR MONITORING AND/OR ANALYSIS OF ELECTRICAL MACHINES DURING OPERATION

This patent application is a continuation for International Patent Application No. PCT/EP2003/050611, filed on Sep. 5, 2003, which claims priority to Swiss Patent Application No. CH 2002 1531/02, filed on Sep. 10, 2002. The entire disclosure of both applications is incorporated by reference herein.

The present invention relates to an apparatus and a method for monitoring and/or analysis of electrical machines during operation. The electrical machine in this case comprises at least one generator with a shaft and drive means for driving this shaft, wherein the shaft is essentially directly grounded at the first end of the generator, and wherein a measurement unit for measurement of shaft voltage and/or shaft current as a function of time is provided on the shaft at the second end of the generator. This is, in particular, an apparatus for use in power station installations.

BACKGROUND

Electrical machines, in particular large electrical machines such as those used in power station installations, should be monitored continuously and/or should be analyzed from time to time in order to ensure smooth operation, in order to identify fault states in good time, and in order to avoid uncontrolled failures.

There are various methods and apparatuses for this purpose for a large number of possible fault states, and these will be described briefly.

For example, U.S. Pat. No. 5,006,769 describes an apparatus for detection of turns shorts in the rotor winding of generators. In this case, the shaft voltage is measured via a specific grounding module, and is analyzed in a specific manner by means of Fourier transformation.

For its part, EP 0271678 proposes an apparatus which allows statements to be made about the suitability for use and the functional reliability of the shaft grounding and the insulation of the shaft. The apparatus proposed in this case, which is actually intended to reduce shaft voltages, allows statements to be made about the overall grounding conditions in the electrical machine.

DE 19742622 describes an apparatus which allows the identification of spark erosion on the shaft, (particularly in the bearings), as can occur when high voltages are present and which is generally associated with damaging effects, when measuring the shaft current and shaft voltage on the shaft.

A large number of documents describe apparatuses which are used for detection of brush sparking on the sliprings. These include, for example, U.S. Pat. No. 3,653,019, U.S. Pat. No. 4,058,804, U.S. Pat. No. 4,163,227 and U.S. Pat. No. 4,451,786. In this case, a measurement apparatus which must be provided specifically for this purpose is connected directly to the brushes and, and this is the major aspect of these documents, data processing is then carried out which makes it possible to distinguish between interference signals and useful signals. This is done primarily using the gating method in which interference signals are identified and the detection process is interrupted during the interference signals (blanking). Another method for detection of brush sparking is proposed in U.S. Pat. No. 4,577,151, in which a characteristic signal is detected via an antenna which must be provided specifically for this purpose, and is then supplied to an analysis unit. For this purpose, the antenna must be arranged in the vicinity of the sliprings in order to receive the corresponding radio-frequency signals. The signals are then amplified and demodulated in a specific analysis unit, and are then supplied to a detector.

One method for identification of a further fault state is described in U.S. Pat. No. 4,814,699. This relates to the detection of partial discharges in the stator, rotor and in the excitation apparatus. In this case, the shaft is used as an antenna and the radio-frequency pulses are output via one of the (insulated) shaft bearings or via a coupling coil which must be provided specifically for this purpose. The shaft bearings must for this purpose be electrically insulated from ground and must also be designed so as to make it possible to distinguish between interference signals in this specific signal and useful signals.

A further serious fault state which must likewise be monitored is oscillations in the shaft run of the machine, in particular in a turbogenerator run. These oscillations may be of a different nature. They may be bending oscillations or transverse vibration occurring in the direction at right angles to the shaft. Furthermore, so-called hunting may occur, that is to say quasi-periodically-damped changes in the rotation frequency of the shaft above the mains frequency of normally 50 Hz (or 60 Hz) and which are produced by, for example, sudden disturbances in the mains. The actual torsional oscillations which can be produced, for example, by sudden load increases on the mains are recognized as a third type of shaft oscillation. In this case, torsional oscillations are oscillations which manifest themselves in a non-standard rotational frequency along the shaft (phase shifts or frequency shifts), that is to say they produce torsion on the shaft.

Torsional oscillations are very small oscillations, normally in the region of 0.01 degrees phase amplitude, but which nevertheless can lead to a very major load on the shaft and, in particular, coincidence between the natural frequency of such a torsional oscillation and the stimulus exciting it can lead to dangerous resonant increases in such torsional oscillations, which can even result in the shaft fracturing. Torsional oscillations may in this case be at frequencies from a few Hz up to 200 Hz, with the frequency naturally depending on the material characteristic and thickness of the shaft, the masses which are connected to the shaft and the size of the installation. These torsional oscillations can become extremely critical, particularly in large installations with long shafts.

Owing to the importance of this problem, a large number of patent specifications have also already dealt with oscillations such as these. For example, U.S. Pat. No. 3,934,459 describes test equipment and a method for measurement of the torsional oscillations of the entire shaft run of a turbine/generator system. The torsional oscillations are recorded at one or more points on the shaft for this purpose by means of one or more sensors which are not specified in any more detail but must be provided specifically for this purpose. The further processing of the torsional signals is the main subject of this document. The further processing is carried out by filtering using bandpass filters and by means of multiplication operations in order, at the end, to determine the maximum torsional torques.

U.S. Pat. No. 3,885,420, U.S. Pat. No. 4,148,222, U.S. Pat. No. 4,137,780 and U.S. Pat. No. 4,317,371 should also be cited with reference to oscillations, all of which describe test equipment and/or methods for measurement of torsional oscillations in electrical installations such as these. Toothed wheels which are connected to the shaft and must be provided specifically for this purpose are used as signal transmitters for detection of the torsional oscillations, and produce electrical signals by means of sensors. The signals are processed further by means of bandpass filters and multiples, etc. U.S. Pat. No. 4,317,371 describes one specific demodulation method for measurement of phase shifts. The method comprises the production of relatively low intermediate frequencies followed by frequency demodulation, as is known per se from radio engineering. Another method (U.S. Pat. No. 3,885,420) uses a PPL (phase locked loop) for demodulation. U.S. Pat. No. 4,444,064 is also cited, which describes a method in which, first of all, a magnetic pattern must be additionally applied to the shaft, and is then used as a pulse transmitter. Another concept for measurement of torsional oscillations is based on using the voltage at the phase winding terminals of the generator (which uses permanent magnet excitation and is coupled to the shaft) in order to determine such oscillations. The torsional oscillations are deduced by evaluation of the voltages that are produced and are tapped off by means of appropriate terminals. The evaluation process is once again carried out by means of frequency demodulation (PPL technique). This arrangement has the advantage that its costs are lower than those of the toothed wheel solution.

Further fault states which may possibly occur and which should also be mentioned include, for example, defective insulation on the rotor winding as well as rotationally synchronous shattering marks and/or witness marks which should likewise be detected in order to prevent failures.

SUMMARY OF THE INVENTION

An object of the present invention is to provide an alternative apparatus for comprehensive detection of fault states in an electrical machine, which apparatus is sufficiently accurate and at the same time is physically simple, can be produced cheaply and is robust and which, in particular, allows continuous monitoring during normal operation. The present invention provides a device for monitoring and/or analysis of electrical machines during operation wherein the electrical machine has at least one generator with a shaft and drive means for driving this shaft, wherein the shaft is essentially directly grounded at the first end of the generator, and wherein a measurement unit for measurement of shaft voltage and/or shaft current as a function of time is provided on the shaft at the second end of the generator.

According to the present invention, shaft voltage signals and/or shaft current signals are provided to an analysis unit, with the analysis unit allowing combined and simultaneous analysis of at least two potential fault states of the electrical machine.

The present invention provides, on the one hand, confirmation that the measurement of the shaft voltage and/or shaft current allows statements to be made about very different behavior patterns and fault states of an electrical machine. If the analysis unit is modified appropriately such that it is able to record the signals that are characteristic of different fault states in a combined and simultaneous form, then this results in combination test equipment which can be operated with the elements which are normally already present in any case (grounding at one end of the generator and a unit for measurement of the shaft voltage at the other end of the generator). Such combination test equipment, in which a number of fault states can be detected simultaneously on the basis of one measurement and thus, to a certain extent, on the basis of a single data record, allows considerably more detailed analysis of the signals, with improved capabilities for combined interpretation of different effects. In contrast to the situation where individual items of test equipment are used for each fault state as in the prior art, it is thus possible in an appliance such as this to produce and investigate simultaneous/cross-relationships between the individual phenomena/measurement results without any adjustment between different appliances. There are thus a large number of fault states and abnormalities which, if considered on their own, would possibly not yet indicate a critical situation but which, when they occur together with a further different fault state, may be an indication of a critical state. With the conventional method, in which individual fault states are considered in an uncoordinated manner, it is thus possible for the installation to be shutdown even though this might not actually have been necessary. The proposed combination test equipment can, in contrast, allow considerably more reliable diagnoses of fault states. In particular, such combination test equipment has the major advantage that it is also possible to produce an automatic correlation between different fault states, allowing specific warning messages (e.g. alerts). In contrast to the prior art, it is possible to use not just peak values and mean values but, in fact, measurements in the frequency domain and in the time domain over the entire spectrum of the signal, that is to say in the low-frequency range and in the radio-frequency range, simultaneously.

The shaft voltages and shaft currents considered in this case occur, inter alia, as a result of magnetic unbalances in the area surrounding the generator shaft, owing to electrostatic charges on the generator shaft, as a result of external electrical fields which capacitively couple shaft voltages into the generator shaft, or owing to magnetic remanences in the rotating shaft, for example, by residual magnetization of the shaft.

Fundamentally, shaft voltages and shaft currents represent a potential danger for various components in the generator and can lead to generator damage if they are either not reduced to a tolerable extent or else the shaft run grounding concept is not suitable. In the past, specific precautions have been taken on the generator shaft for this purpose by, for example, incorporating insulating gaps at the non-drive end of the generator and by connecting the generator shaft to ground potential via brushes at the drive end. In order to reduce voltage peaks, the generator shaft is often AC-coupled to ground potential via a capacitance and by means of a sliding contact with the non-drive end.

A further factor of the invention is also the surprising discovery that the shaft current or the shaft voltage contains not only the information mentioned above according to EP-A1-0 271 678 relating to the suitability for use and functional reliability of the shaft grounding or else the information according to EP-A2-0 391 181, which can also be cited, relating to rotor turns shorts, but that, furthermore, extensive information about further fault states is concealed in these signals, and that this information can be evaluated synchronously in a single analysis unit. It is, accordingly, possible, for example, to dispense with apparatuses which must normally be provided specifically for measurement of oscillations and to measure the shaft voltage and/or the shaft current by means of appliances which may already be present for monitoring the suitability for use or for monitoring rotor turns shorts, and to use the data obtained in this way to draw conclusions about oscillations of the shaft at the same time as other fault states. The measurement of the shaft current and/or the shaft voltage is in this case a sufficiently accurate method, which, in particular, is highly suitable for long-term observations, in order to determine fault states.

The fault states which can be accessed via this analysis unit by the measurement of the shaft voltage and/or shaft current are at least two different fault states selected from the following group: turns shorts in the rotor winding; functional weakness of the shaft grounding as well as insulation weakness in the shaft; insulation weakness in the rotor winding; spark erosion on the shaft; brush sparking, in particular on the sliprings; partial discharges in the stator and/or in the rotor and/or in the excitor apparatus; oscillations of the shaft, in particular torsional oscillations and/or bending oscillations and/or hunting; sparks in the excitation apparatus and/or the rotor winding; rotationally synchronous shattering marks and/or witness marks. Amazingly, all of these fault states are accessible via one such measurement and, in particular, it is in each case possible to monitor pairs or entire groups of these fault states synchronously and in a coordinated manner. At least one of the fault states is preferably radio-frequency spark activity such as spark erosion on the shaft or sparks in the excitation apparatus and/or the rotor winding, or dangerous oscillations of the shaft such as transverse bending oscillations, hunting or torsional oscillations. These combinations allow particularly powerful joint analyses.

One preferred embodiment of the apparatus is characterized in that a grounding unit is provided in order to ground the shaft at the first end of the generator, and itself allows the measurement of the shaft voltage and/or shaft current as a function of time. These signals (measured values) are also supplied to the analysis unit, are combined in the analysis unit and are evaluated simultaneously with the signals from the measurement unit. The additional measurement at the second end of the generator (or, in the case of two or more generators, at different points between these generators) by means of the measurement unit allows effective localization of fault states along the shaft. This makes it possible, for example, to find the bearing in which shaft erosion is actually occurring, since the differential behavior of the two measured values from the grounding unit and from the measurement unit allows conclusions to be drawn.

A further preferred embodiment of the apparatus is distinguished by the analysis unit carrying out an evaluation both in the low-frequency range and in the radio-frequency signal range. In this case, in particular, the analysis unit has means which can be used to filter the relevant signals on a frequency-selective basis. The various fault states produce signal components in different frequency ranges. For example, it may be useful to use the low-frequency range simultaneously and in a combined form, preferably by means of Fourier analysis, for determination of turns shorts and/or dangerous shaft oscillations, and use the radio-frequency range to determine spark activity.

In a corresponding manner, it is advantageous, to filter the incoming signals to the analysis unit inter alia to improve the distinction between different phenomena and to improve the signal-to-noise ratio. These means may in this case be a low-pass filter and a radio-frequency bandpass filter, by means of which the incoming signals (signal from the shaft voltage or shaft current on the measurement unit and grounding unit, respectively) are filtered either simultaneously or in a switched manner alternatively. The means may either be in the form of passive filters, or else frequency-selective amplifiers may be used. The low-pass filter can preferably pass frequencies below 20 kHz, and the radio-frequency bandpass filter can, preferably adjustably, pass frequencies in the range from 20 kHz to 40 MHz, in particular preferably from 1 MHz to 40 MHz.

A further preferred embodiment of the present invention has the feature that the analysis unit is additionally supplied with further data or signals (which are not based on the measurement of the shaft voltage and/or shaft current) about fault states, and these are monitored and/or analyzed with respect to fault states combined and simultaneously with the shaft voltage and/or the shaft current. Such additional data or signals may, for example, comprise measurement signals from the partial discharge measurements on the stator phase windings or measurements of spark activity on the slipring brushes. If these additional data items or signals which are detected by other mechanisms are likewise supplied to the analysis unit, then further correlations can be found between fault states, and can be used for diagnosis.

According to a further embodiment of the invention, the evaluation in the analysis unit is carried out as a sampling process, preferably using an analog/digital converter (ADC), preferably using a sampling rate which corresponds to the mains frequency or to an integer multiple of the mains frequency divided by the number of pole pairs of the generator. The appropriate signal can be investigated with respect to frequency modulations, and/or amplitude modulations and/or frequency lines contained in it, particularly in baseband, in the analysis unit in order to analyze the shaft voltage and/or the shaft current. In this case, transient processes in the spectrum can also be evaluated. The signals are advantageously evaluated by means of a Fourier transformation. This is done in that, if necessary after demodulation or down-mixing of the signal with a carrier frequency, for example at the mains frequency and/or its integer harmonics divided by the number of pole pairs, a Fourier transform is produced in sections, and the resulting spectrum is analyzed for line broadening and/or sidebands and/or for frequency lines in baseband. In this case, the signal is normally sampled at a sampling rate of 1–200 kHz, in particular for low-frequency components in the region of 5 kHz, and is sampled in the region of 200 kHz for the radio-frequency components, and the signal is then Fourier transformed in each case in sections in the range from 0.5 k to 1 000 k data points, in particular in the region of 64 k data points, in order to determine fine structures.

A further preferred embodiment of the present invention is distinguished in that a grounding unit (drive end module) is provided at the first location and has a high resistance to the contact apparatus on the shaft, and has a low resistance to ground wherein a fuse is arranged parallel with the high resistance, and wherein a measurement resistance is arranged preferably and in particular between ground and the low resistance and wherein the shaft voltage is tapped off between the high resistance and the contact apparatus and the ground connection, and the shaft current is tapped off across the measurement resistance. This part, the measurement unit is preferably designed as follows. It has a fuse to the contact apparatus on the shaft and has one or more capacitances which are arranged in parallel and, in parallel with them, a resistance to the ground. In this case a measurement resistance is arranged between ground and the capacitance and the resistance, wherein the shaft voltage is tapped off between the fuse and the ground connection, and the shaft current is tapped off across the measurement resistance. This type of measurement allows interference free observation, protected against voltage spikes and current surges by the fuses that are provided.

Further preferred embodiments of the apparatus according to the invention are described in the dependent claims.

The present invention also relates to a method for monitoring and/or analysis of electrical machines during operation, wherein the electrical machine has at least one generator with a shaft and drive means for driving this shaft, wherein the shaft is grounded with low resistance at the first end of the generator, and wherein a measurement unit for measurement of shaft voltage and/or shaft current as a function of time is provided on the shaft at the second end of the generator. In this case, signals from the shaft voltage and/or shaft current are supplied to an analysis unit and a combined and simultaneous analysis for at least two potential fault states in the electrical machine is carried out in the analysis unit. These are preferably the fault states mentioned further above, and the method is preferably carried out using an apparatus as described above.

Further preferred embodiments of the method according to the invention are described in the dependent claims.

BRIEF DESCRIPTION OF THE DRAWING

The invention will be explained in more detail in the following text using exemplary embodiments and in conjunction with the drawing, in which.

DETAILED DESCRIPTION

Figure 1:
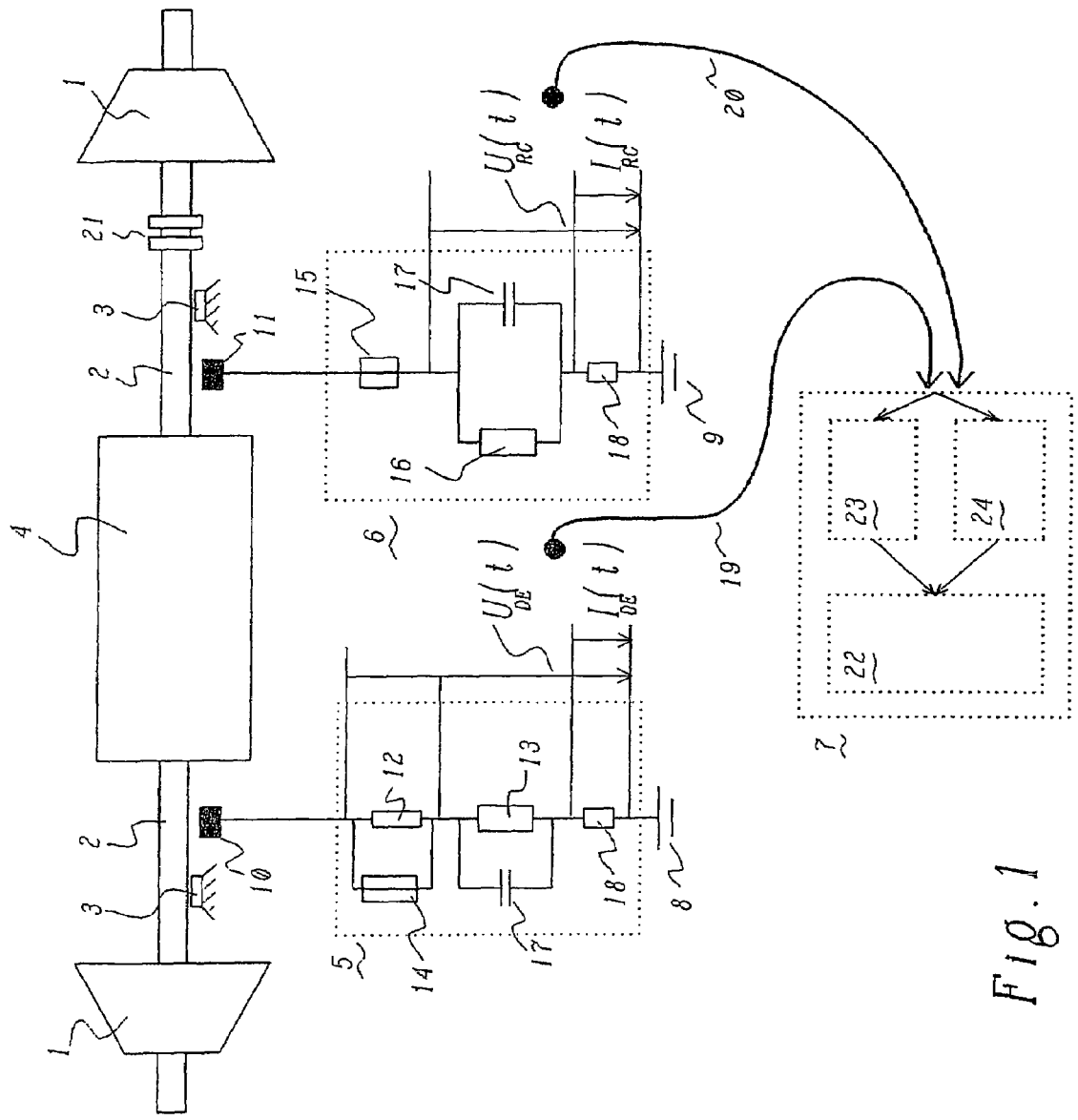
FIG. 1 shows a schematic illustration of an apparatus for measurement of shaft voltage $U_{RC}(t)$ and/or $U_{DE}(t)$, and shaft current $I_{RC}(t)$ and/or $I_{DE}(t)$ as a function of the time (t).

The FIGURE shows a schematic illustration of a gas turbine installation in which two turbines 1 are arranged at the two ends of a generator 4 as drive means, with the two turbines 1 as well as the generator 4 being arranged in a common shaft 2 or a shaft run. The two turbines should be regarded in this case only as being by way of example, and it is also possible for only one turbine to be arranged there. In order to make it possible to disconnect the generator 4 from the turbines 1, for example for acceleration, conventional couplings are provided and allow the turbines 1 to be mechanically decoupled from the generator 4.

The shaft 2 is mounted on at least two shaft bearings 3. The oil films in the bearings 3 electrically insulate the shaft 2 from the bearings 3, which are connected to ground. This insulation may, however, collapse in response to voltage spikes above a specific magnitude, and this can lead to electrical erosion problems (spark erosion on the shaft).

As already mentioned in the introduction, shaft voltages and shaft currents also occur for various reasons on a shaft of a generator 4 such as this, whose frequency spectrum extends from DC up to frequencies which are a multiple of the rotational frequency of the generator or else are related to the frequencies of a static excitation system for the generator. Frequencies of up to several MHz may occur.

The shaft voltages and shaft currents may be caused, inter alia, by magnetic imbalances in the area surrounding the shaft 2, by electrostatic charges on the shaft 2, by external electrical fields, which capacitively couple the shaft voltages into the shaft 2, or by magnetic remanences in the rotating shaft 2, as well as by residual magnetization (production-dependent) on the shaft 2.

The shaft voltages, referred to in the following text as U(t), and shaft currents, referred to in the following text as I(t), fundamentally represent a risk to various components of the generator and can lead to generator damage. According to the invention, however, the shaft voltage or the shaft current is now used for specific analysis and detection of various fault states in an electrical machine.

For this purpose, a low-resistance grounding unit, for example a so-called DE module 5 (drive end module) is connected to the shaft 2 at one end of the generator 4, and essentially ensures reliable low-impedance grounding of the shaft 2. The DE module 5 is connected to the analysis unit 7.

At the other end of the generator 4, a higher-resistance grounding device, a so-called RC module 6 (R for resistance and C for capacitance), which is connected to the analysis unit 7, is connected on the one hand to the shaft 2 and on the other hand to the grounding point 9 as a measurement unit for measurement of the shaft voltage ($U_{RC}(t)$) and/or shaft current ($I_{RC}(t)$) as a function of time.

The DE module 5 is connected to the shaft 2 via a contact apparatus 10. The contact apparatus 10 is preferably a copper mesh which makes a sliding electrical contact with the shaft 2. The DE module 5 has a low impedance to the grounding point 8 by first of all a high resistance 12, and then a fuse 14 in parallel with this high resistance 12, being connected between the contact apparatus 10 and the grounding point 8. This is intended to prevent excessively high currents occurring. The DE module 5 thus primarily ensures low-impedance grounding of the shaft 2. A low resistance 13 is connected to earth in series with this high resistance 12 and the fuse 14. The resistance 13 typically has a value R in the range from 1 to 10 ohms. In order furthermore to make it possible to short radio-frequency voltage spikes (typically at 150–200 kHz), a capacitor 17 with a capacitance C in the region of 3–10 µF is arranged in parallel with the low resistance. Otherwise, there will be a risk of voltage spikes such as these being dissipated via the bearing shells, and leading to sparks being formed there.

The shaft voltage $U_{DE}(t)$ is tapped off as a function of time between the high resistance 12 and the contact apparatus 10 or ground, and is passed via a coaxial cable 19 to the analysis unit 7. In order to monitor the state of the fuse 14, it is also at the same time possible to monitor the voltage between the resistances 12 and 13 and ground. Furthermore, a measurement resistance 18 (shunt resistance) is connected between ground and the low resistance 13, which can be used to calculate and also describe the shaft current $I_{DE}(t)$, from the voltage drop which occurs across it. This information is also passed via the coaxial cable 19 to the analysis unit 7.

The RC module 6 is normally arranged at the other end of the generator 4, in order to dissipate the voltage spikes. This likewise has a contact apparatus 11 to the shaft 2, which is once again preferably in the form of a copper mesh that is in electrical contact with the shaft 2. First of all, the RC module 6 has a fuse 15 to the shaft, normally a fuse of the 2AT type (in this case as well, the fuse is used for protection against high currents), and, in series with this, a resistance 16, with a capacitance 17, that is in the form of a capacitor, being arranged in parallel with this resistance 16. In an entirely general form, the resistance 16 which is arranged in parallel with the capacitance 17 has a value R in the range from 100 to 10 000 ohms, preferably from 400 to 1 000 ohms. The capacitance 17 has a typical value C in the range from 1 to 30 µF.

The shaft voltage $U_{RC}(t)$ is now tapped off as a function of time between the fuse 15 and the grounding point 9, and is passed to the analysis unit 7 via a coaxial cable 20. A measurement resistance 18 (shunt resistance) is furthermore once again connected between the grounding point 9 and the parallel arrangement formed by the resistance 16 and the capacitance 17, and can be used to calculate and also describe the shaft current $I_{RC}(t)$ from the voltage drop which occurs across it.

The measured shaft voltage as a function of time $U_{RC}(t)$, $U_{DE}(t)$, or the measured shaft current as a function of time $I_{RC}(t)$, $I_{DE}(t)$ now contains information about the various fault states of the electrical machine, which will be listed by way of example in the following text:

A) Turns Shorts in the Rotor Winding:

As described in U.S. Pat. No. 5,006,769, turns shorts such as these lead to characteristic harmonic components in the signal from the shaft voltage or shaft current. The signals vary in the range below 1 kHz, that is to say in the low-frequency range, and occur at integer multiples of the rotor rotation frequency. If the rotation frequency is 50 Hz, characteristic signals are correspondingly observed at 100 Hz, 200 Hz, when turns shorts are actually present in the rotor winding. Only weak signals are observed at these frequencies when no turns shorts are present.

B) Grounding State of the Shaft and Insulation State of the Shaft:

The presence of these fault states is observed in the time domain and is evident in characteristic interruptions in the signal, normally in the region from 1 to 6 ms. The characteristic signals which occur are described in EP 271678 A1, which likewise states how deliberate diagnoses are possible from these signals. In particular, the combination of the measured value of the shaft voltage via the DE module 5 and the RC module 6 allows more accurate localization of the corresponding fault location.

C) Insulation State of the Rotor Winding:

A fault state here leads to a low-frequency signal in the region below 1 kHz. In a similar way to that in the case of a turns short in the rotor winding, characteristic multiples of the mains frequency can be observed when the rotor winding insulation is faulty. If the mains frequency is 50 Hz, specific bands are observed at 300 Hz, 600 Hz, 900 Hz, etc., and, corresponding to a 6-pulse voltage, bands at 150 Hz, 300 Hz, etc.

D) Spark Erosion of the Shaft:

If this fault state occurs, then characteristic signals are observed in the radio-frequency range, that is to say above about 500 kHz. Sharp spikes are observed in the time signal from the shaft voltage or shaft current, typically at 1.5 MHz or 40 MHz etc. The spikes are in this case similar to the pulses which occur with partial discharges.

E) Brush Sparking on the Sliprings:

In this case as well, the presence of this fault state leads to characteristic, radio-frequency spikes in the signal (in this context, see the prior art document as cited above; the corresponding signals which are observed via the shaft voltage or the shaft current are mentioned analogously in these documents). The observed signals are, however, in different band ranges than those which are observed with spark erosion.

F) Partial Discharges in the Stator/Rotor/Excitor:

When partial discharges such as these occur, then spikes are observed in a frequency range considerably above 500 kHz. The signals observed via the shaft voltage or shaft current are essentially signals which are analogous to those which are described in U.S. Pat. No. 4,814,699, which was cited initially.

G) Shaft Vibration:

This is in the form of vibrations such as transverse bending oscillations of the shaft 2 (Type I movement), hunting of the shaft 2 (Type II movement) or torsional oscillations of the shaft 2 (Type III movement). Hunting is in this context changes in the rotation speed of the rotor about the actual nominal frequency. It occurs, for example, when disturbances occur in the mains system, which is typically operated at 50 or 60 Hz, and these disturbances are coupled into the movement of the rotor and, for example, slow it down. This leads to the rotor frequency hunting around the nominal frequency, which may be particularly critical when this hunting is at an actual frequency of the system since, in this case, resonant oscillation becomes possible.

Torsional oscillations occur, for example, when a sudden load increase occurs on the mains and this load increase results, so to speak, in the generator being briefly braked (which, of course, also results in hunting once again).

The evaluation of the shaft current or shaft voltage allows all three movement types I, II and III to be diagnosed. In this case, frequency demodulation methods, which are insensitive to amplitude fluctuations, can preferably be used for measurement of torsional oscillations (Type III) and hunting (Type II). Methods for amplitude demodulation can be used for measurement of bending oscillations (Type I). In both cases, a large number of harmonics of the shaft system may be used in this case.

Bending oscillations (Type I) are evident in the corresponding spectrum on the one hand as sidebands of the shaft voltage/current harmonics, with the sidebands being separated by the modulation frequency. This is due to the fact that oscillations of this type cause amplitude modulations of the signal $U(t)$ or $I(t)$, in which case the modulation frequency may be about 1 to 300 Hz, and these modulations can be seen both on the fundamental of the shaft voltage/shaft current and on the corresponding harmonics. Bending oscillations are thus possible by simple consideration or analysis of lines and of their sidebands. This analysis can be carried out visually, or else in an automated form. Furthermore, bending oscillations are also evident as frequency lines in baseband, that is to say as sidebands around O Hz. Hunting oscillations (Type II) normally take place around the fundamental frequency of the rotor. These are rapid changes in the rotation frequency, that is to say changes on a timescale of less than 1 second. In the Fourier spectrum, this leads to line broadening on the line of the rotation frequency and on the harmonics. These are broadened areas or shifting of the frequency in the range from 3 to 4 parts per thousand. In the corresponding manner, the occurrence of hunting can be identified visually or in an automated form from such broadened lines and, in particular, their occurrence can be analyzed sequentially in time.

Torsional oscillations (Type III) lead to fine structures in the spectrum since the frequencies are normally high. Torsional oscillations are normally in the range from 100 to 200 Hz and lead to very rapid frequency shifts or phase shifts on this timescale. Once again, these can be identified and analyzed in the spectrum visually or in an automated form.

H) Sparks in the Excitation Device or the Rotor Winding.

Radio-frequency characteristic signals are also observed in this case.

I) Rotationally Synchronous Shattering Marks and/or Witness Marks:

Shattering marks such as these occur when, for example, the bearing shell makes a sliding contact. Witness marks are electrical witness marks. These fault states are evident in signals in both the low-frequency and radio-frequency ranges. Witness marks are observed, for example, in the low-frequency range while, however, periodic sparks can also be observed in specific areas of the radio-frequency frequency range.

An important factor is now that these different phenomena which, according to the prior art, are measured by different test equipment and coupling units can now be analyzed in a single analysis unit 7, primarily on the basis of the shaft voltage, so that cross-relationships between the individual measurement results can easily be produced and investigated. In this case, the shaft voltage is measured in the low-frequency and in the radio-frequency signal range. This is particularly advantageous because some phenomena allow clear statements only in conjunction with other phenomena and represent a danger to the machine only when they occur in combination. By way of example, a turns short will have no disturbing effect on operation unless severe vibration also occurs at the same time. Simultaneous measurement has thus been found to be highly advantageous, since correlations can be identified.

The analysis process is based on the use of algorithms which are used to define the fault states mentioned above. Some algorithms use signals both from the low-frequency range and from the radio-frequency signal range (for example for detection of witness marks, or shaft insulation). Furthermore, some algorithms also use results from other measurement algorithms and relate them to one another in order to improve the diagnosis validity. The (simultaneous) combination of two or more measurement methods results in better and more valid results than the addition of all the individual methods on their own. The following specific combinations are intended to serve as examples of this:

- Combination of vibration analysis with the simultaneous analysis for turns short in the same appliance. This is advantageous since turns shorts have a disturbing effect on operation only when they cause vibration.
- Combination of vibration analysis with analysis of witness marks on the shaft. If vibration leads to a witness mark or vice versa, as can be identified from corresponding simultaneous occurrence of the two characteristic signals, then a danger to operation must be expected.
- Combination of the measurement of the radio-frequency activity (spark erosion) on the shaft with the measurement of the witness marks. In their own right, witness marks are generally not critical. Likewise, spark erosion need not be critical on its own. However, if these two symptoms occur at the same time then, once again, it is possible to deduce a critical operating state.
- Combination of vibration measurement on the shaft with partial discharge measurement on the stator winding. Once again, severe vibration may be causally linked to partial discharges, and synchronous occurrence may be an indication of a critical state.

These characteristic fault states which occur in a combined form may also be passed very easily to an automated identification process, since they are set synchronously in the single analysis unit 7, with appropriate warning messages being produced with considerably better reliability on the basis of the combined values.

The actual analysis unit 7 comprises two input stages, a radio-frequency input stage 23 and a low-frequency input stage 24. The radio-frequency input stage 23 comprises a radio-frequency bandpass filter (reception band with a steep flank and from about 20 kHz up to the MHz range, preferably with the width of frequency up to being adjustable). This bandpass filter 23, which is, for example, in the form of a frequency-selective amplifier, separates interference signals (for example thyristor pulses) from useful signals (for example signals from sparks). Useful signals in the passband are detected, while interference signals in the stop band of the filter are suppressed. This makes use, by way of example, of the knowledge that the thyristor switching signals are generally at a low frequency in comparison to the spark signals from brush sparking. In an entirely general form, different phenomena can be distinguished from one another by reception in different frequency bands.

The low-frequency input stage 24 is designed for frequencies up to about 20 kHz. Once again, this stage may comprise a passive low-pass filter or a selective low-frequency amplifier. The low-frequency signals are thus conditioned.

The signals from the input stages are then passed to a combined analysis unit 22. For analysis in the frequency domain, it has been found to be particularly appropriate to carry out the evaluation with the aid of a Fourier transformation of the time signal $U_{RC}(t)$ and/or $U_{DE}(t)$ or $I_{RC}(t)$ and/or $I_{DE}(t)$. In order to improve the measurement accuracy or to simplify the filtering of the input data, the corresponding time signal can be mixed with a carrier signal or with the corresponding carrier signal shifted through $\pi/2$ in the sense of square detection and may be stored in a separate real and imaginary part, and Fourier-transformed (FFT). Suitable carrier signals include, for example, the mains frequency or integer multiples of it, which, if required, can be tapped off for this purpose directly from the mains or at some other suitable point, or can be produced locally.

The incoming signal $U_{RC}(t)$ and/or $U_{DE}(t)$ (typically in the range below 15 V) or $I_{RC}(t)$ and/or $I_{DE}(t)$ are/is first of all digitized in an analog/digital converter (ADC) using a typical sampling rate of 5 kHz (low-frequency signals from the low-frequency input stage 24) and 200 kHz (radio-frequency signals from the radio-frequency input stage 23), respectively, and this digitized time signal $U^{dig}(t)$ or $I^{dig}(t)$ is then Fourier-transformed in sections. In order to analyze, for example, torsions, Fourier transformation of in each case one window of, for example, 65 k data points has been found to be worthwhile in this case, while, for investigation of, for example, bending oscillations, a window of just 1 k data points is normally sufficient, since the corresponding spectrum features are of a considerably coarser nature.

The signal can also be sampled at a sampling rate which corresponds to the mains frequency or is an integer multiple of the mains frequency divided by the number of pole pairs of the generator (mains-phase-synchronous analysis). This results in a frequency shift by precisely this sampling frequency. It is thus possible, for example, to detect rotationally synchronous shattering marks or witness points particularly easily.

In a further embodiment, the measurement on the shaft is combined with partial discharge measurements at the phase terminals, as described by way of example in U.S. Pat. No. 4,814,699. This results in the capability to distinguish pulses from partial discharges in the stator winding from spark activities on the shaft, or to complement the partial discharge measurement.

In a further embodiment, signals which are also tapped off directly from the slipring brushes (see U.S. Pat. No. 3,653,019) are also analyzed for radio-frequency and low-frequency signals and are likewise evaluated by means of combined algorithms together with the data obtained from the shaft voltage or shaft current.

Fundamentally, however, there is a major advantage in outputting directly on the shaft, since it is possible to measure all the spark activities on the shaft, for example discharges via the bearing shafts. Measurement at both ends of the generator 4 furthermore allows good localization of the phenomena which occur.

In this context, it should be noted that the present method is very particularly suitable for long-term operation of the behavior of the shaft runs, since the equipment complexity is relatively small and the sensor, that is to say the shaft, is always present. It is therefore possible to use gradual slow changes in the fault states of an electrical machine to deduce the possible need for maintenance work, and appropriate maintenance work can be planned and carried out specifically.

What is claimed is:

1. An apparatus for monitoring and/or analysis of electrical machines during operation, the electrical machine having at least one generator with a shaft and a drive element for driving the shaft, the apparatus comprising:
 a shaft grounding configured to ground the shaft at a first end of the generator;
 a measurement unit disposed on the shaft at a second end of the generator and configured to measure at least one of a shaft voltage and a shaft current as a function of time so as to obtain at least one first signal; and
 an analysis unit configured to receive the at least one first signal and to perform a combined and simultaneous analysis for at least two potential fault states in the electrical machine, wherein the analysis unit is configured to perform the analysis both in a low-frequency and in a radio-frequency signal range.

2. The apparatus as recited in claim 1, wherein the at least two potential fault states are selected from the group consisting of:
 a turns short in a rotor winding of the electrical machine; a functional weakening of the shaft grounding; an insulation weakness in the shaft; an insulation weakness in the rotor winding; a spark erosion on the shaft; a brush sparking; a partial discharge in at least one of a stator, a rotor and an excitor apparatus of the electrical machine; a dangerous oscillation of the shaft; sparks in at least one of the excitation apparatus and the rotor winding; and at least one of rotationally synchronous shattering and witness marks.

3. The apparatus as recited in claim 1, wherein at least one of the fault states includes at least one of radio-frequency spark activity, and dangerous oscillations of the shaft.

4. The apparatus as recited in claim 1, wherein the radio-frequency spark activity includes at least one of a spark erosion on the shaft and sparks in at least one of an excitation apparatus and a rotor winding of the electrical machine and the dangerous oscillations include at least one of transverse bending oscillations, hunting and torsional oscillations of the shaft.

5. The apparatus as recited in claim 1, wherein the shaft grounding includes a grounding unit for providing a second measurement of at least one of the shaft voltage and the shaft current as a function of time so as to provide at least one second signal, and wherein the analysis unit is configured to receive the at least one second signal and to combine the at least one second signal with the at least one first signal and to evaluate the at least one second signal simultaneously with the at least one first signal.

6. The apparatus as recited in claim 5, wherein the analysis unit is configured to receive at least one further signal indicative of a fault state, the at least one further signal not being based on a measurement of the shaft voltage or shaft current, and wherein the analysis unit is configured to evaluate the at least one further signal in a combined and simultaneous manner with at least one of the at least one first signal and the at least one second signal.

7. The apparatus as recited in claim 1, wherein the analysis unit is configured to use the low-frequency range, simultaneously and in a combined form, to determine at least one of a turns short and a dangerous oscillation of the shaft, and to use the radio-frequency range to determine a spark activity.

8. The apparatus as recited in claim 7, wherein the analysis unit is configured to determine the at least one of the turns short and the dangerous oscillation using Fourier analysis.

9. The apparatus as recited in claim 1, wherein the analysis unit is configured to perform a sampling process as part of the analysis.

10. The apparatus as recited in claim 9, wherein the analysis unit includes analog/digital converter for use in performing the sampling process.

11. An apparatus for monitoring and/or analysis of electrical machines during operation, the electrical machine having at least one generator with a shaft and a drive element for driving the shaft, the apparatus comprising:
 a shaft grounding configured to ground the shaft at a first end of the generator;
 a measurement unit disposed on the shaft at a second end of the generator and configured to measure at least one of a shaft voltage and a shaft current as a function of time so as to obtain at least one first signal; and
 an analysis unit configured to receive the at least one first signal and to perform a combined and simultaneous analysis for at least two potential fault states in the electrical machine,
 wherein the shaft grounding includes a grounding unit for providing a second measurement of at least one of the shaft voltage and the shaft current as a function of time so as to provide at least one second signal,
 wherein the analysis unit is configured to receive the at least one second signal and to combine the at least one second signal with the at least one first signal and to evaluate the at least one second signal simultaneously with the at least one first signal, and
 wherein the analysis unit includes at least one filtering element for filtering the at least one first signal and the at least one second signal on a frequency-selective basis.

12. The apparatus as recited in claim 11, wherein the at least one filtering element includes a low-pass filter and a radio-frequency bandpass filter configured to filter the at least one first signal and the at least one second signal, either simultaneously or alternatively in a switched manner.

13. The apparatus as recited in claim 12, wherein the low-pass filter passes frequencies below 20 kHz, and the radio-frequency bandpass filter adjustably passes frequencies in the range from 20 kHz to 40 MHz.

14. The apparatus as recited in claim 13, wherein the radio-frequency bandpass filter adjustably passes frequencies in the range from 1 MHz to 40 MHz.

15. An apparatus for monitoring and/or analysis of electrical machines during operation, the electrical machine having at least one generator with a shaft and a drive element for driving the shaft, the apparatus comprising:
 a shaft grounding configured to ground the shaft at a first end of the generator;
 a measurement unit disposed on the shaft at a second end of the generator and configured to measure at least one of a shaft voltage and a shaft current as a function of time so as to obtain at least one first signal; and an analysis unit configured to receive the at least one first signal and to perform a combined and simultaneous analysis for at least two potential fault states in the electrical machine, wherein the analysis unit is configured to perform a sampling process as part of the analysis, wherein the shaft grounding includes a grounding unit for providing a second measurement of at least one of the shaft voltage and the shaft current as a function of time so as to provide at least one second signal, wherein the analysis unit is configured to receive the at least one second signal and to combine the at least one second signal with the at least one first signal and to evaluate the at least one second signal simultaneously with the at least one first signal, wherein the analysis unit is configured to perform a sampling process as part of the analysis, and wherein a sampling rate is used in the sampling process corresponding to one of a mains frequency and an integer multiple of the mains frequency divided by a number of pole pairs of the generator.

16. An apparatus for monitoring and/or analysis of electrical machines during operation, the electrical machine having at least one generator with a shaft and a drive element for driving the shaft, the apparatus comprising:

a shaft grounding configured to ground the shaft at a first end of the generator;

a measurement unit disposed on the shaft at a second end of the generator and configured to measure at least one of a shaft voltage and a shaft current as a function of time so as to obtain at least one first signal; and an analysis unit configured to receive the at least one first signal and to perform a combined and simultaneous analysis for at least two potential fault states in the electrical machine, wherein the analysis unit is configured to perform a sampling process as part of the analysis, wherein the shaft grounding includes a grounding unit for providing a second measurement of at least one of the shaft voltage and the shaft current as a function of time so as to provide at least one second signal, wherein the analysis unit is configured to receive the at least one second signal and to combine the at least one second signal with the at least one first signal and to evaluate the at least one second signal simultaneously with the at least one first signal, and wherein the analysis unit is configured to investigate the at least one first signal with respect to at least one of a frequency modulation, an amplitude modulation, and frequency lines contained in at least one of the at least one first signal and the at least second signal, so as to analyze the at least one first signal.

17. The apparatus as recited in claim 16, wherein the frequency lines are in baseband.

18. The apparatus as recited in claim 16, wherein the analysis unit is configured to evaluate transient processes in a spectrum of at least one of the at least one first signal and the at least second signal.

19. The apparatus as recited in claim 16, wherein at least one of the at least one first signal and the at least second signal is sampled at a sampling rate of 1–200 kHz, and is Fourier-transformed in each case in sections in the range from 0.5 k to 1 000 k data points.

20. The apparatus as recited in claim 19, wherein at least one of the at least one first signal and the at least second signal is sampled for low-frequency components in the region of 5 kHz and is sampled in the region of 200 kHz for radio-frequency components.

21. The apparatus as recited in claim 20, wherein at least one of the at least one first signal and the at least second signal is Fourier-transformed in each case in sections in the region of 64 k data points.

22. An apparatus for monitoring and/or analysis of electrical machines during operation, the electrical machine having at least one generator with a shaft and a drive element for driving the shaft, the apparatus comprising:

a shaft grounding configured to ground the shaft at a first end of the generator;

a measurement unit disposed on the shaft at a second end of the generator and configured to measure at least one of a shaft voltage and a shaft current as a function of time so as to obtain at least one first signal; and an analysis unit configured to receive the at least one first signal and to perform a combined and simultaneous analysis for at least two potential fault states in the electrical machine, wherein the analysis unit is configured to perform a sampling process as part of the analysis, wherein the shaft grounding includes a grounding unit for providing a second measurement of at least one of the shaft voltage and the shaft current as a function of time so as to provide at least one second signal, wherein the analysis unit is configured to receive the at least one second signal and to combine the at least one second signal with the at least one first signal and to evaluate the at least one second signal simultaneously with the at least one first signal, wherein the analysis unit is configured to perform a sampling process as part of the analysis, and wherein the sampling process includes performing a Fourier transform in sections of at least one of the at least one first signal and the at least second signal and a resulting spectrum is analyzed for at least one of line broadening, sidebands, and frequency lines in baseband.

23. The apparatus as recited in claim 22, wherein the Fourier transform is performed after demodulation or downmixing of at least one of the at least one first signal and the at least second signal with a carrier frequency.

24. The apparatus as recited in claim 23, wherein the carrier frequency is at least one of a mains frequency and an integer harmonics of the mains frequency divided by a number of pole pairs.

25. An apparatus for monitoring and/or analysis of electrical machines during operation, the electrical machine having at least one generator with a shaft and a drive element for driving the shaft, the apparatus comprising:

a shaft grounding configured to ground the shaft at a first end of the generator;

a measurement unit disposed on the shaft at a second end of the generator and configured to measure at least one of a shaft voltage and a shaft current as a function of time so as to obtain at least one first signal; and an analysis unit configured to receive the at least one first signal and to perform a combined and simultaneous analysis for at least two potential fault states in the electrical machine, wherein the shaft grounding includes a grounding unit having a contact apparatus for contacting the shaft, a high resistance to the contact apparatus, a low resistance to a grounding point, a fuse disposed in parallel with the high resistance, and a measurement resistance, and wherein the grounding unit is configured to tap off the shaft voltage between the high resistance and the contact apparatus and the grounding point, and to tap off the shaft current across the measurement resistance.

26. The apparatus as recited in claim 25, wherein the measurement resistance is disposed between the grounding point and the low resistance.

27. An apparatus for monitoring and/or analysis of electrical machines during operation, the electrical machine having at least one generator with a shaft and a drive element for driving the shaft, the apparatus comprising:
 a shaft grounding configured to ground the shaft at a first end of the generator;
 a measurement unit disposed on the shaft at a second end of the generator and configured to measure at least one of a shaft voltage and a shaft current as a function of time so as to obtain at least one first signal; and
 an analysis unit configured to receive the at least one first signal and to perform a combined and simultaneous analysis for at least two potential fault states in the electrical machine,
 wherein the measurement unit has a contact apparatus on the shaft, a fuse connected to the contact apparatus, one or more capacitances disposed in parallel with each other, a resistance to the grounding point disposed in parallel with the one or more capacitances, and a measurement resistance disposed between the grounding point and the parallel-disposed one or more capacitances and resistance, and wherein the shaft voltage is tapped off between the fuse and the grounding point and the shaft current is tapped off across the measurement resistance.

28. A method for monitoring and/or analysis of electrical machines during operation, the electrical machine having at least one generator with a shaft and a drive element for driving the shaft, the method comprising:
 grounding the shaft at a first end of the generator;
 measuring at least one of a shaft voltage and a shaft current as a function of time using a measurement unit disposed on the shaft at a second end of the generator;
 providing at least one signal indicative of at least one of the shaft voltage and the shaft current to an analysis unit; and
 performing a combined and simultaneous analysis for at least two potential fault states in the electrical machine using the analysis unit, wherein the analysis is performed both in a low-frequency and in a radio-frequency signal range.

29. The method as recited in claim 28, wherein the at least two potential fault states are selected from the group comprising:
 a turns short in a rotor winding of the electrical machine; a functional weakening of the shaft grounding; an insulation weakness in the shaft; an insulation weakness in the rotor winding; a spark erosion on the shaft; a brush sparking; a partial discharge in at least one of a stator, a rotor and an excitor apparatus of the electrical machine; a dangerous oscillation of the shaft; sparks in at least one of the excitation apparatus and the rotor winding; and at least one of rotationally synchronous shattering and witness marks.

* * * * *